(12) United States Patent
Shih et al.

(10) Patent No.: US 7,538,434 B2
(45) Date of Patent: May 26, 2009

(54) COPPER INTERCONNECTION WITH CONDUCTIVE POLYMER LAYER AND METHOD OF FORMING THE SAME

(75) Inventors: Chien-Hsueh Shih, Taipei (TW); Minghsing Tsai, Chu-Pei (TW); Hung-Wen Su, Jhubei (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 352 days.

(21) Appl. No.: 11/075,072

(22) Filed: Mar. 8, 2005

(65) Prior Publication Data

US 2006/0202346 A1   Sep. 14, 2006

(51) Int. Cl.
*H01L 23/48* (2006.01)
(52) U.S. Cl. .............. 257/751; 257/752; 257/753; 257/758; 257/759; 257/774; 257/40; 257/E23.145
(58) Field of Classification Search ......... 257/751–753, 257/758, 759, 774, 40; 438/627
See application file for complete search history.

(56) References Cited

U.S. PATENT DOCUMENTS

| | | | |
|---|---|---|---|
| 6,130,157 A | 10/2000 | Liu et al. | |
| 6,225,681 B1 * | 5/2001 | Chungpaiboonpatana et al. | 257/642 |
| 6,350,667 B1 | 2/2002 | Chen et al. | |
| 6,432,811 B1 * | 8/2002 | Wong | 438/619 |
| 6,482,656 B1 * | 11/2002 | Lopatin | 438/2 |
| 6,566,171 B1 * | 5/2003 | Liu et al. | 438/132 |
| 6,566,260 B2 * | 5/2003 | Chooi et al. | 438/687 |
| 6,600,229 B2 * | 7/2003 | Mukherjee et al. | 257/762 |
| 6,645,847 B2 * | 11/2003 | Paranjpe et al. | 438/622 |
| 6,682,989 B1 * | 1/2004 | Goodner et al. | 438/454 |
| 6,696,360 B2 * | 2/2004 | Ahn et al. | 438/632 |
| 6,716,753 B1 | 4/2004 | Shue et al. | |
| 6,734,110 B1 | 5/2004 | Jang et al. | |
| 6,737,727 B2 | 5/2004 | Gates et al. | |
| 6,900,488 B1 * | 5/2005 | Lopatin et al. | 257/295 |
| 7,019,386 B2 * | 3/2006 | Ghoshal et al. | 257/642 |
| 7,084,053 B2 * | 8/2006 | Golzarian et al. | 438/610 |
| 7,091,616 B2 * | 8/2006 | Suminoe et al. | 257/773 |
| 7,098,537 B2 * | 8/2006 | Cabral et al. | 257/751 |
| 7,129,133 B1 * | 10/2006 | Avanzino et al. | 438/244 |
| 7,145,245 B2 * | 12/2006 | Kloster et al. | 257/762 |
| 7,205,664 B2 * | 4/2007 | Tsumura et al. | 257/758 |
| 7,332,813 B2 * | 2/2008 | Ueno | 257/762 |
| 2005/0236711 A1 * | 10/2005 | Wang et al. | 257/751 |
| 2006/0027924 A1 * | 2/2006 | Chen et al. | 257/751 |

\* cited by examiner

*Primary Examiner*—Eugene Lee
(74) *Attorney, Agent, or Firm*—Slater & Matsil, L.L.P.

(57) ABSTRACT

A conductive polymer between two metallic layers acts a glue layer, a barrier layer or an activation seed layer. The conductive polymer layer is employed to encapsulate a copper interconnection structure to prevent copper diffusion into any overlying layers and improve adhesive characteristics between the copper and any overlying layers.

23 Claims, 8 Drawing Sheets

COPPER INTERCONNECTION WITH CONDUCTIVE POLYMER LAYER AND METHOD OF FORMING THE SAME

TECHNICAL FIELD

The present invention relates to semiconductor structures and fabricating methods used for integrated circuit devices, and more particularly to copper interconnections and methods of forming the same.

BACKGROUND

Microelectronic integrated circuits based on patterned semiconductor materials are continuing to evolve towards devices with an extremely high density of circuit elements per unit volume. As the features of these devices are reduced to smaller sizes, the performance of the materials that constitute the device will critically determine their success. One specific area in need of advancement is the smaller conducting interconnects composed of materials with higher conductivity and greater mechanical integrity, which presently favors the use of copper (Cu), with twice the conductivity of aluminum and three times the conductivity of tungsten, as the material of choice. Another specific area in need of advancement is the electrical insulator used between the wires, metal lines, and other elements of the circuit. An insulating material that possesses a dielectric constant as low as possible, such as a dielectric constant (k) below the dielectric constant of silicon dioxide, about 3.9, has long been used in integrated circuits as the primary insulating material to avoid increased problems of capacitive coupling (cross-talk) and propagation delay.

Copper is much more susceptible to oxidation during processing. Copper also tends to diffuse into adjacent materials, including dielectrics. To use copper for interconnections, therefore, it is necessary to encapsulate the copper with barrier materials. It is common for a copper damascene process to use a barrier metal layer, such as titanium nitride, or tantalum nitride, deposited between a copper layer and an underlying material. After the copper layer is deposited, an encapsulation barrier layer, such as silicon nitride, tungsten, tungsten nitride, or titanium nitride, is deposited overlying the copper. U.S. Pat. No. 6,716,753, incorporated herein by reference, describes a method of nitridizing an upper surface of a copper layer to form a self-passivation layer comprised of titanium nitride. U.S. Pat. No. 6,130,157, incorporated herein by reference, describes a tungsten nitride encapsulation layer over copper interconnects. The problem with the copper encapsulation techniques used in the conventional arts is poor adhesion between the copper and the barrier material. Thus, an encapsulation layer serving as a barrier to diffusion of the copper layer into any overlying layers while improving adhesive characteristics between copper and any overlying layers is needed.

Physical vapor deposition (PVD) of the barrier metal layer has associated overhang, asymmetry, and sidewall coverage issues prior to copper electroplating, and it is becoming increasingly difficult to achieve continuous liner coverage on aggressive dual damascene structures. Liner coverage that is too thin or discontinuous on any surface will result in copper migration through such holes, causing reliability problems. Chemical vapor deposition (CVD) or atomic layer deposition (ALD) techniques that provide better step coverage of the barrier metal layer than PVD techniques, however, are generally more costly and encounter poor adhesion issues between copper and low-k dielectrics. There is therefore a need for a barrier layer that provides the desired adhesion between the low-k dielectric layer and the copper interconnects while still preventing oxidation and diffusion of the copper layer.

Wire bonding technologies for copper interconnects often utilize an aluminum layer to cap the exposed copper wire bond pad. This aluminum cap is added to allow use of the same wire bonding tools and processes used in aluminum interconnect technologies. When the aluminum metal is deposited on copper, however, most of the aluminum is consumed when reacting with the underlying copper, forming $CuAl_2$. A barrier layer of tantalum nitride inserted between the underlying copper pad and the top aluminum pad is necessary to prevent the reaction between these metals, but the accompanying problem of poor adhesion that exists between tantalum nitride and copper must be overcome. U.S. Pat. No. 6,350,667, incorporated herein by reference, describes an adhesion aluminum layer inserted between tantalum nitride and copper for improving adhesion in the pad metal stack structure. The present invention is also directed to a copper interconnection that is protected from copper oxidation, and provides improved surface adherence qualities for the top-level copper layer and the wire-bonding aluminum pad.

SUMMARY OF THE INVENTION

Embodiments of the present invention provide a conductive polymer that encapsulates a metallic layer to improve adhesion between the metallic layer and any overlying materials.

Other embodiments of the present invention provide a conductive polymer that encapsulates a metallic layer to function as an activation seed layer for a subsequent metal plating process.

In one embodiment, the present invention provides a semiconductor device having a first conductive polymer layer formed between a first metallic layer and a second metallic layer. The first conductive polymer layer is preferably an organic material including electroactive conjugated conducting polymers comprising polyaniline, polypyrrole, polythiophene, polyethylenevinylene or poly-4-vinyl pyridine. The first metallic layer is preferably formed of copper, and the second metallic layer may be formed of copper, copper-based alloys, Co, Ni, Co-based alloys, Ni-based alloys, aluminum, or aluminum-based alloys. A diffusion barrier layer of Ta, TaN, Ti, TiN, Co, Ni, Pt, Ru, W, Pd or Au may be formed between the first conductive polymer layer and the second metallic layer.

In another embodiment, the present invention provides a semiconductor device having a dielectric layer with an opening formed on a semiconductor substrate, wherein a copper-based metallic layer is formed in the opening, and a first conductive polymer layer is formed on the upper surface of the copper-based metallic layer. The first conductive polymer layer is preferably an organic material including electroactive conjugated conducting polymers comprising polyaniline, polypyrrole, polythiophene, polyethylenevinylene or poly-4-vinyl pyridine. A metallic layer of copper, copper-based alloys, Co, Ni, Co-based alloys, or Ni-based alloys is formed on the first conductive polymer layer. The dielectric layer preferably has a dielectric constant less than about 3.9.

In another embodiment, a diffusion barrier layer of Ta, TaN, Ti, TiN, Co, Ni, Pt, Ru, W, Pd, or Au lines the opening of the dielectric layer and is sandwiched between the copper-based metallic layer and the dielectric layer. In one embodiment, a second conductive polymer layer is formed on the dielectric layer in the opening and is sandwiched between the copper-based metallic layer and the dielectric layer. The second conductive polymer layer connects to the first conductive polymer layer. A diffusion barrier layer may be optionally inserted between the second conductive polymer layer and the copper-based metallic layer. The upper surface of the first conductive polymer layer may be higher than the upper surface of the dielectric layer. Alternatively, the upper surface of the first conductive polymer layer may be planar with the upper surface of the dielectric layer.

In yet another embodiment, the present invention provides a semiconductor device having a dielectric layer formed on a semiconductor substrate, a copper-based metallic layer embedded in the dielectric layer and having an exposed surface, a conductive polymer layer formed on the exposed surface of the copper-based metallic layer, and an aluminum-based metallic pad formed on the conductive polymer layer. The conductive polymer layer is preferably an organic material including electroactive conjugated conducting polymers comprising polyaniline, polypyrrole, polythiophene, polyethylenevinylene or poly-4-vinyl pyridine. A passivation layer is preferably formed on the dielectric layer and has an opening that defines the exposed surface of the copper-based metallic layer. A diffusion barrier layer of Ta, TaN, Ti or TiN may line the opening of the passivation layer to be sandwiched between the aluminum-based metallic pad layer and the conductive polymer layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The aforementioned features and advantages of this invention will become apparent by referring to the following detailed description of the preferred embodiments with reference to the accompanying drawings, wherein.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention provide a conductive polymer between two metallic layers to act as a glue layer, a barrier layer and/or an activation seed layer. In one embodiment, the conductive polymer layer is employed to encapsulate a copper interconnection structure to prevent copper diffusion into any overlying layer and improve adhesive characteristics between the copper and any overlying layer. The overlying layer may include, but is not limited to, a dielectric material, diffusion barrier materials, copper (Cu), cobalt (Co), nickel (Ni), platinum (Pt), ruthenium (Ru), tantalum (Ta), tantalum nitride (TaN), titanium (Ti), titanium nitride (TiN), tungsten (W), palladium (Pd), gold (Au), Co-containing alloys, or Ni-containing alloys. The conductive polymer layer may also act as an activation seed layer for electroless self-initiated Co-containing alloys or Ni-containing alloys deposition. In one embodiment, the conductive polymer is inserted between a copper layer and an interlayer dielectric (ILD) layer in a copper damascene structure to serve as a diffusion barrier layer, a glue layer and/or a seed layer for a copper plating process. The ILD layer is preferably a low-k dielectric layer having a dielectric constant (k value) less than about 3.9. In one embodiment, the conductive polymer layer is formed between an aluminum pad and an underlying copper wiring to provide good adhesion properties for a robust metal pad stack.

Preferred embodiments of the present invention have wide applicability to many manufacturers, factories and industries, including integrated circuit fabrications, microelectronic fabrications, and optical electronic fabrications. As used throughout this disclosure, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. As will be described more fully later, damascene process provides a more exact dimensional control over small geometries, while copper, as the metallization material, provides greater electrical characteristics. In the context of integrated circuits, the term "damascene" implies a patterned layer imbedded on and in another layer such that the upper surfaces of the two layers are coplanar. Thus, in semiconductor manufacturing, trenches and/or vias in appropriate locations in the trenches are formed in an insulating material by etching, which are then filled with metal. The damascene process is repeated as many times as required to form the multi-level interconnections between metal lines and the vias formed therebetween. Although the preferred embodiments of the present invention illustrate copper interconnection patterns using a dual damascene process, the present invention provides value when using single damascene processes and non-damascene methods.

Hereinafter, reference will now be made in detail to the presently preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented.

Figure 1:
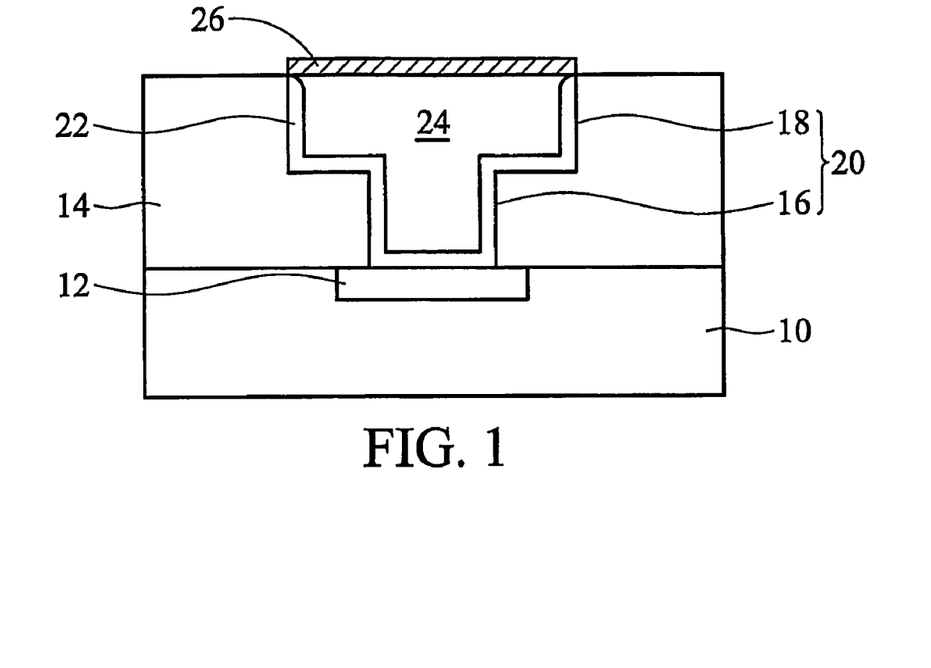
FIG. 1 is a cross-sectional diagram illustrating a copper damascene structure encapsulated by a conductive polymer layer according to one embodiment of the present invention.
Figure 1A:
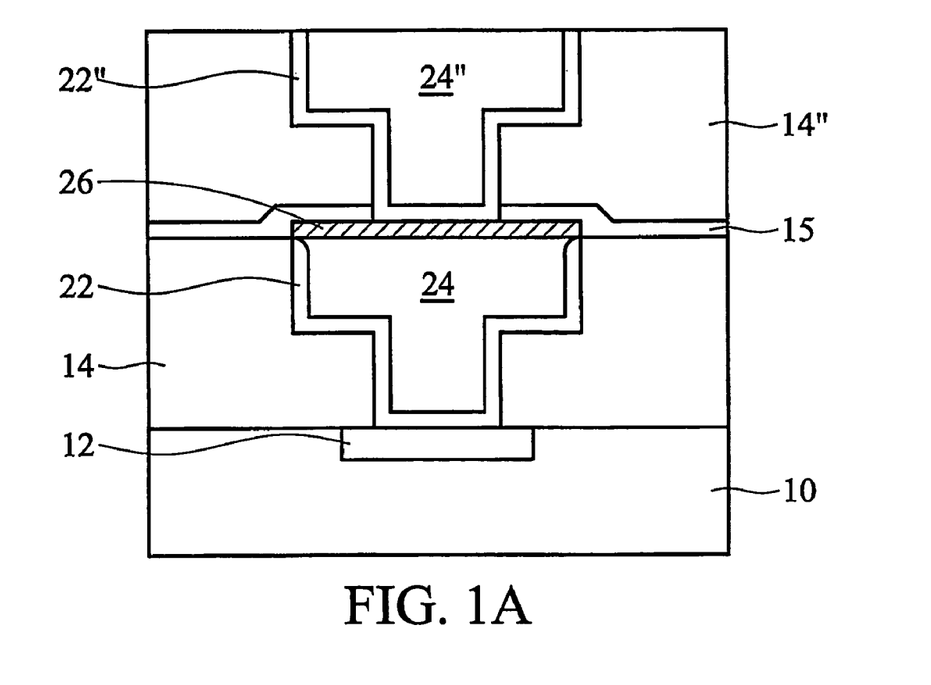
FIG. 1A is a cross-sectional diagram illustrating a copper interconnection stack according to one embodiment of the present invention.

FIG. 1 is a cross-sectional diagram illustrating a copper damascene structure encapsulated by a conductive polymer layer according to one embodiment of the present invention. FIG. 1A is a cross-sectional diagram illustrating a copper interconnection stack according to one embodiment of the present invention.

An example of a substrate 10 used for interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. The integrated circuits as used herein refer to electronic circuits having multiple individual circuit elements, such as transistors, diodes, resistors, capacitors, inductors, and other active and passive semiconductor devices. The substrate 10 comprises a conductive region 12, which is a portion of conductive routes and has an exposed surface treated by a planarization process, such as chemical mechanical polishing (CMP), if necessary. Suitable materials for the conductive region 12 may include, but are not limited to, copper, aluminum, copper alloy, or other mobile conductive materials.

As depicted in FIG. 1, an interlayer dielectric (ILD) layer 14 is deposited on the substrate 10, and a dual damascene opening 20 including an upper trench section 18 and a lower via hole section 16 is then patterned in the ILD layer 14. While a dual damascene structure is illustrated as an example, the present invention is applicable to single damascene and other damascene structures as well. In order to define a contact region, the lower via hole section 16 exposes a portion of the conductive region 12. In dual damascene techniques, the upper trench section 18 and the lower via hole section 16 may be formed using a typical lithographic process with masking technologies and anisotropic etch operations (e.g., plasma etching or reactive ion etching). A bottom etch stop layer, a middle etch stop layer, a polish stop layer, or an anti-reflective coating (ARC) layer may be optionally deposited on or intermediately in the ILD layer 14, providing a clear indicator of when to end a particular etching process. An example of an etch stop layer 15 is depicted in FIG. 1A, but omitted in FIG. 1 for clarity. The etch stop layer 15 may be formed of silicon oxide, silicon nitride, silicon carbide, silicon oxynitride or combinations thereof, with a thickness of about 10 angstroms to about 1,000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The ILD layer 14 is formed to a thickness of about 1,000 angstroms to about 20,000 angstroms through any of a variety of techniques, including, spin coating, CVD, and future-developed deposition procedures. The ILD layer 14 is preferably formed of a comparatively low dielectric constant dielectric material with a k value less than about 3.9, e.g., 3.5 or less. A wide variety of low-k materials may be employed in accordance with embodiments of the present invention, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, or porous organic series material.

A diffusion barrier layer 22 is conformally deposited along the bottom and sidewalls of the dual damascene opening 20 prior to a copper-fill process, thus providing both an excellent diffusion barrier in combination with good conductivity. A metallic layer 24 is then formed by means of the electroplating method for example, thus completely filling the dual damascene opening 20. The metallic layer 24 and the diffusion barrier layer 22 extending over the ILD layer 14 is then removed by means of CMP or other suitable etch back processes. At this time, it is preferred that a CMP process is performed until the ILD layer 14 is exposed to achieve a planarized surface. The diffusion barrier layer 22 may include, but is not limited to, a refractory material, TiN, TaN, Ta, Ti, TiSN, TaSN, W, WN, Cr, Nb, Co, Ni, Pt, Ru, Pd, Au, CoP, CoWP, NiP, NiWP, mixtures thereof, or other materials that can inhibit diffusion of copper into the ILD layer 14 by means of PVD, CVD, ALD or electroplating. The diffusion barrier layer 22 may have a thickness of about 50 to about 500 angstroms.

The metallic layer 24 may include a low resistivity conductor material selected from the group of conductor materials including, but not limited to, copper and copper-based alloy. For example, a copper-fill process includes metal seed layer deposition with about 50 to about 2,500 angstroms in thickness and copper electrochemical plating with about 5,000 to about 15,000 angstroms in thickness. The metal seed layer may include copper, nickel, molybdenum, platinum, or the like by means of PVD, CVD or ALD method. When the diffusion barrier layer 22 is formed of TaN, TiN, TiSiN, TaSiN, Ta, Ti or combinations thereof, a metal seed layer deposition is then needed for a copper electroplating process. Alternatively, the diffusion barrier layer 22 formed of Co, Ni, Pt, Ru, Pd, Au, W, CoP, CoWP, NiP, or NiWP may directly act as a seed layer for copper electroplating, thus an additional metal seed layer is not required.

An advantageous feature of the present invention is that a conductive polymer layer 26 is selectively deposited on the exposed surfaces of the metallic layer 24 and the diffusion barrier layer 22 to serve as an encapsulation layer that can prevent ion diffusion of the metallic layer 24 into any overlying layers and improve adhesive characteristics between the metallic layer 24 and any overlying layers. The conductive polymer layer 26 is preferably an organic material including electroactive conjugated conducting polymers containing C, F, N or H, such as polyaniline, polypyrrole, polythiophene, polyethylenevinylene or poly-4-vinyl pyridine, through chemical-grafting, electro-grafting, electroless deposition, photo activation or any suitable surface-grafting techniques. Preferably, a chemical-grafting process incorporates a functional group precursor of electroactive conjugated conducting monomers, such as aniline, pyrrole, thiophene, ethylenevinylene or 4-vinyl pyridine. Preferably, the conductive polymer layer 26 comprises poly-4-vinyl pyridine and has a thickness of about 10 angstroms to about 50 angstroms.

The dual damascene structure depicted in FIG. 1 completes one level of interconnect wiring, and the above-described steps may be repeated to form subsequent levels of interconnect wirings, such as the interconnection stack shown in FIG. 1A. The interconnect structure and method of the present invention thereof has several advantages over prior art methods. First, the thin and conformal conductive polymer 26 capping the copper interconnection structure can provide a better barrier to copper ion diffusion. Second, the conductive polymer layer 26 serves as a glue layer to improve adhesion between copper and any overlying materials, such as dielectric etch stop layer 15. If metal deposition on the conductive polymer layer 26 is subsequently necessary, the conductive polymer layer 26 can function as an activation seed layer for a metal plating process, and adhesion properties between copper and the overlying metallic layers are thereby improved.

Figure 2:
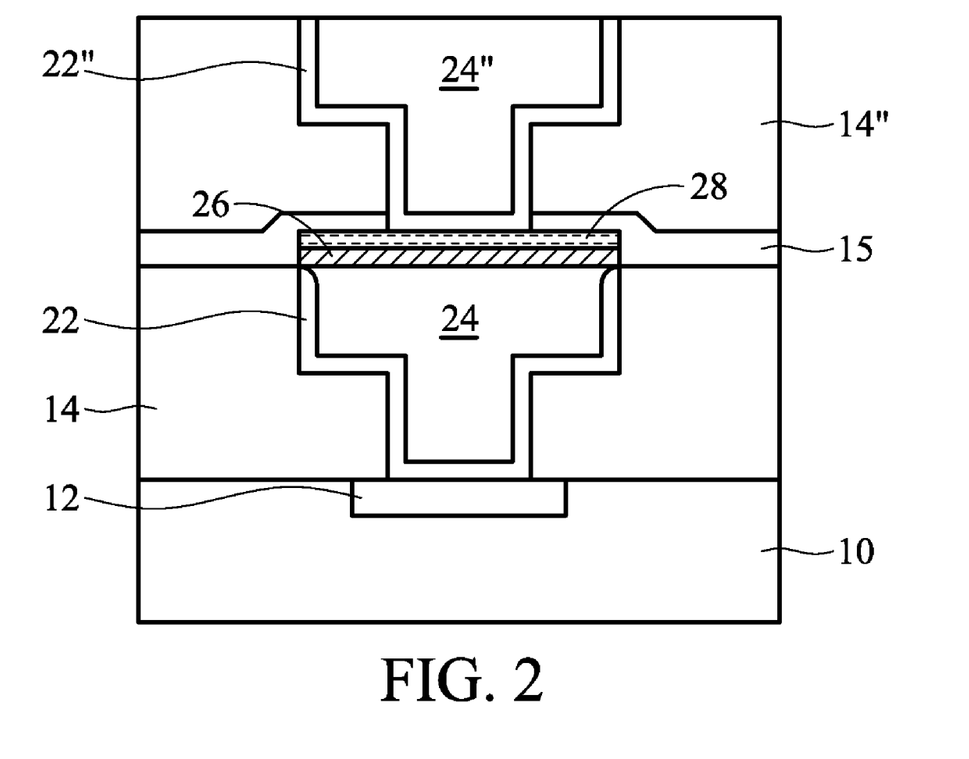
FIG. 2 is a cross-sectional diagram illustrating an exemplary embodiment of a copper damascene structure encapsulated by a conductive polymer layer and a metallic capping layer according to one embodiment of the present invention.

FIG. 2 is a cross-sectional diagram illustrating an exemplary embodiment of a copper damascene structure encapsulated by a conductive polymer layer and a metallic capping layer according to one embodiment of the present invention, while explanation of the same or similar portions to the description in FIG. 1 will be omitted.

Modification of the interconnection structure can be done after the formation of the conductive polymer layer 26. Thus, a subsequent process provides a metallic capping layer 28 selectively deposited on the conductive polymer layer 26, resulting in reduced atomic transport of the metallic layer 24, as well as improved adherence of any overlying materials. The combination of the metallic capping layer 28 and the conductive polymer layer 26 over the metallic layer 24 can provide maximum device reliability. Through any suitable deposition techniques, such as an electroless plating process, the metallic capping layer 28 may include, but is not limited to, cobalt (Co), nickel (Ni), platinum (Pt), ruthenium (Ru), tantalum (Ta), tungsten (W), palladium (Pd), gold (Au), Co-containing alloys (e.g., CoP, CoWP, CoB, CoWB), or Ni-containing alloys (e.g., NiP, NiWP, NiB). A preferred thickness of the metallic capping layer 28 is about 5 nm to about 20 nm. The conductive polymer layer 26 also acts an activation seed layer for electroless self-initiated Co-alloy (or Ni-alloy) deposition.

Figure 3:
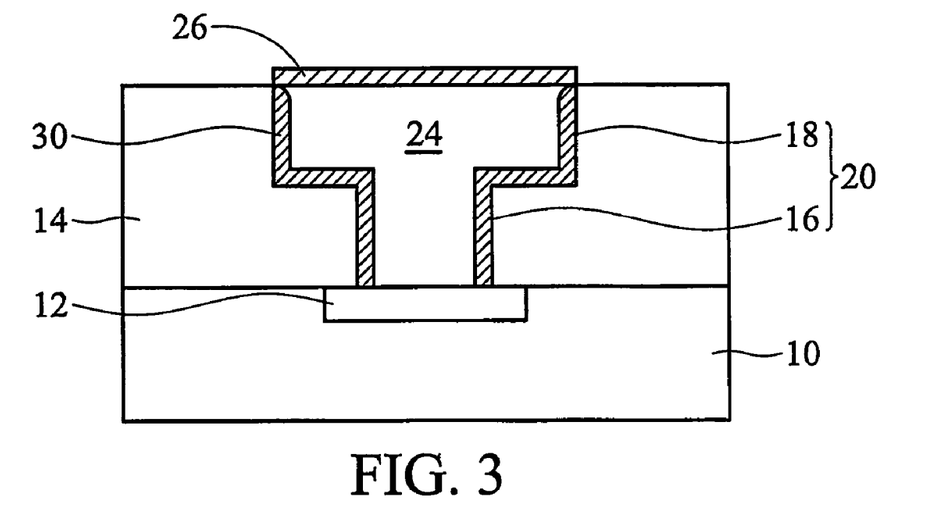
FIG. 3 is a cross-sectional diagram illustrating an exemplary embodiment of a continuous conductive polymer layer inlaid in a copper damascene structure and capping the copper surface according to one embodiment of the present invention.

FIG. 3 is a cross-sectional diagram illustrating an exemplary embodiment of a continuous conductive polymer layer inlaid in a copper damascene structure and capping the copper surface according to one embodiment of the present invention, while explanation of the same or similar portions to the description in FIG. 1 will be omitted.

Compared with the diffusion barrier layer 22 formed of a metal-containing material described in FIG. 1, a conductive polymer layer 30 is selectively formed on the ILD layer 14 along the upper trench section 18 and the lower via hole section 16 to function as a diffusion barrier layer that can prevent metal diffusion of the metallic layer 24 into the ILD layer 14. The conductive polymer layer 30 is an organic material including electroactive conjugated conducting polymers containing C, F, N or H, such as polyaniline, polypyrrole, polythiophene, polyethylenevinylene or poly-4-vinyl pyridine, through electroless process, photo-grafting process, electrochemical polymerization process, or any suitable surface-grafting technique. In one embodiment, an electro-grafting process may use electroactive conjugated conducting monomers, such as aniline, pyrrole, thiophene, ethylenevinylene or 4-vinyl pyridine. In one embodiment, photo-induced graft polymerization may be achieved using benzophenone moieties. The polymerization can be caused to occur on the surface where abstractable hydrogen is available such as the ILD layer 14, without reaction with the conductive region 12. Thus, the conductive polymer layer 30 is formed only on inner sidewalls of the ILD layer 14 and not on the conductive region 12. Preferably, the conductive polymer layer 30 comprises poly-4-vinyl pyridine and has a thickness of about 10 angstroms to about 50 angstroms.

The interconnect structure and method of the present invention thereof has several advantages over prior art methods. First, the conductive polymer layer 30 provides a better barrier to copper diffusion. Second, the thin and conformal conductive polymer layer 30 can achieve continuous liner coverage on aggressive dual damascene structures to overcome the problems associated overhang, asymmetry, and sidewall coverage issues arising from the use of physical vapor deposition, resulting in improved reliability. Third, the conductive polymer layer 30 can act as a glue layer to improve adhesive characteristics between the ILD layer 14 and the metallic layer 24. In addition, the subsequent surface-grafting process for the conductive polymer layer 26 can further cross-link the conductive polymer layer 30 so as to form a continuous conductive polymer scheme.

Figure 4:
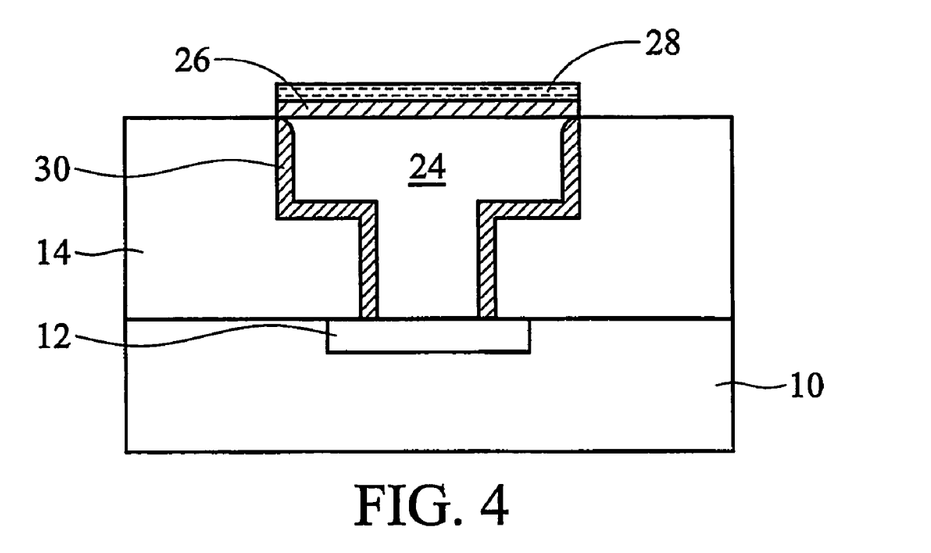
FIG. 4 is a cross-sectional diagram illustrating an exemplary embodiment of a continuous conductive polymer layer with a metallic capping layer according to one embodiment of the present invention.

At this time, modification of the interconnection structure, similar to FIG. 2 depicting a metallic capping layer 28 selectively deposited on the conductive polymer layer 26, can be done to reduce atomic transport of the metallic layer 24 and improve adherence of any overlying materials. FIG. 4 is a cross-sectional diagram illustrating an exemplary embodiment of a continuous conductive polymer layer with a metallic capping layer according to one embodiment of the present invention, while explanation of the same or similar portions to the description in FIG. 2 will be omitted.

Figure 5:
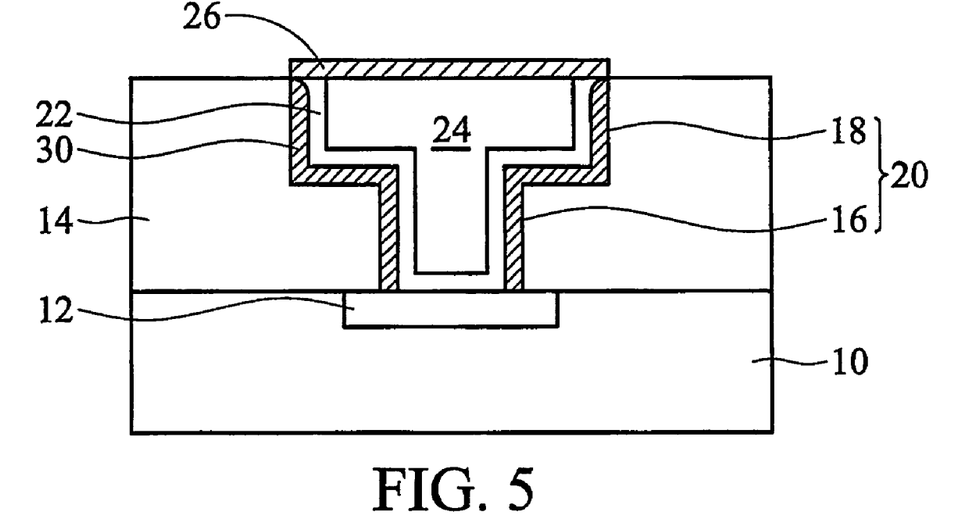
FIG. 5 is a cross-sectional diagram illustrating an exemplary embodiment of a continuous conductive polymer layer with a diffusion barrier layer inlaid in a copper damascene structure according to one embodiment of the present invention.

The conductive polymer layer 30 may be an oligomer end-functionalized with vinyl groups. The oligomer chains may be chosen such that they are conductive enough to act as a seed layer for electroplating, such as a copper electroplating process. Alternatively, they contain moieties that activate electroless deposition of a diffusion barrier layer, such as a copper diffusion barrier layer. As shown in FIG. 5, the diffusion barrier layer 22 is deposited on the conductive polymer layer 30 and the conductive region 12 along the bottom and sidewalls of the dual damascene opening 20, while explanation of the same or similar portions to the description in FIGS. 1 and 3 are omitted. The combination of the conductive polymer layer 30 and the diffusion barrier layer 22 inserted between the ILD layer 14 and the metallic layer 24 can provide maximum device reliability.

Figure 6:
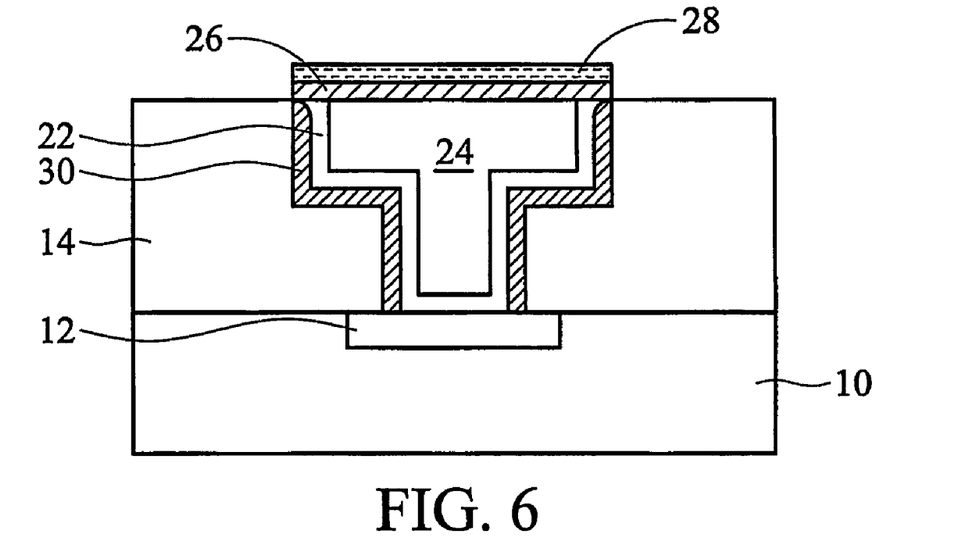
FIG. 6 is a cross-sectional diagram illustrating an exemplary embodiment of a continuous conductive polymer layer with a diffusion barrier layer inlaid in a copper damascene structure and a metallic capping layer according to one embodiment of the present invention.
Figure 7:
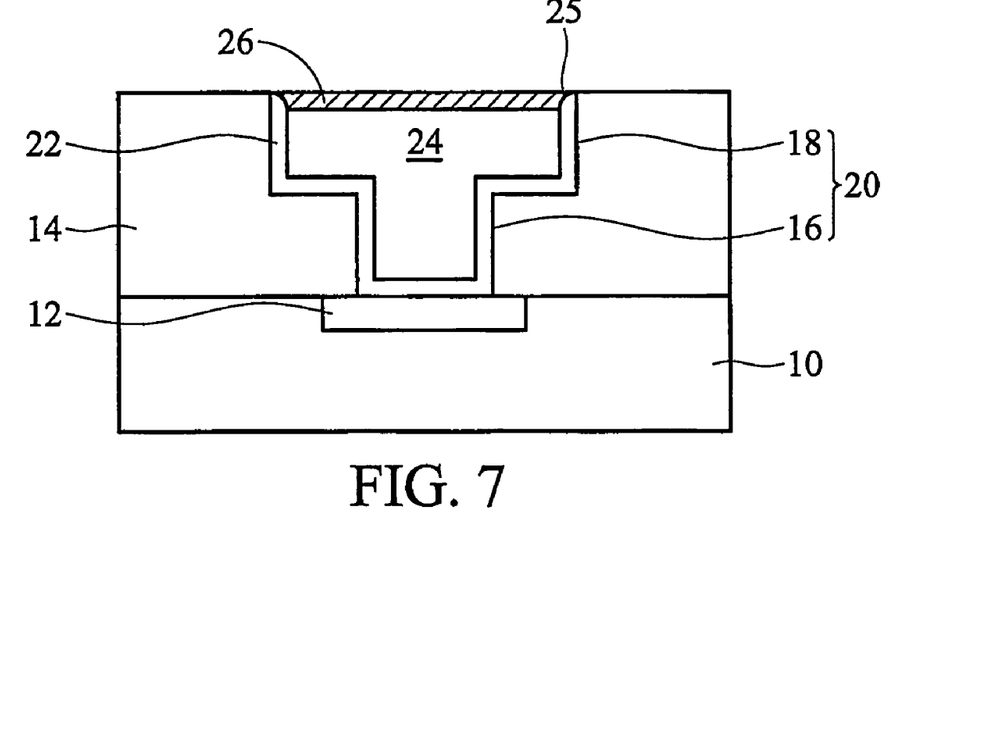
FIGS. 7-12 are cross-sectional diagrams illustrating various copper damascene structures encapsulated by a conductive polymer layer formed in a recess region according to embodiments of the present invention.
Figure 8:
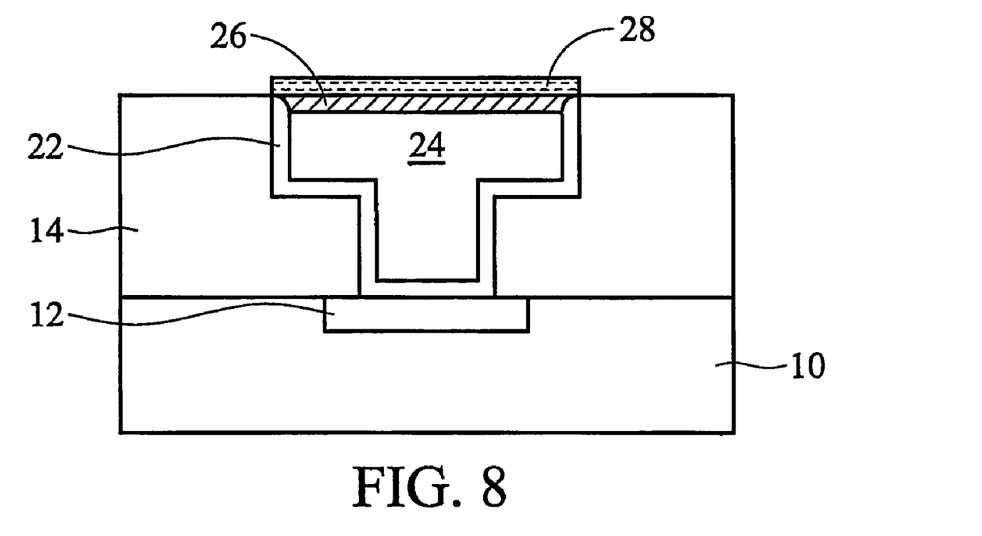
Figure 9:
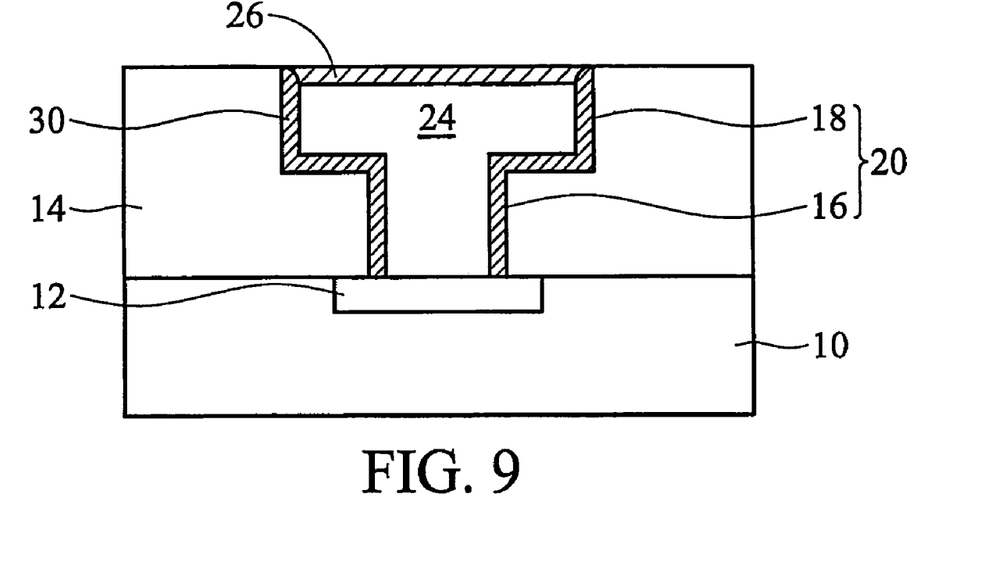
Figure 10:
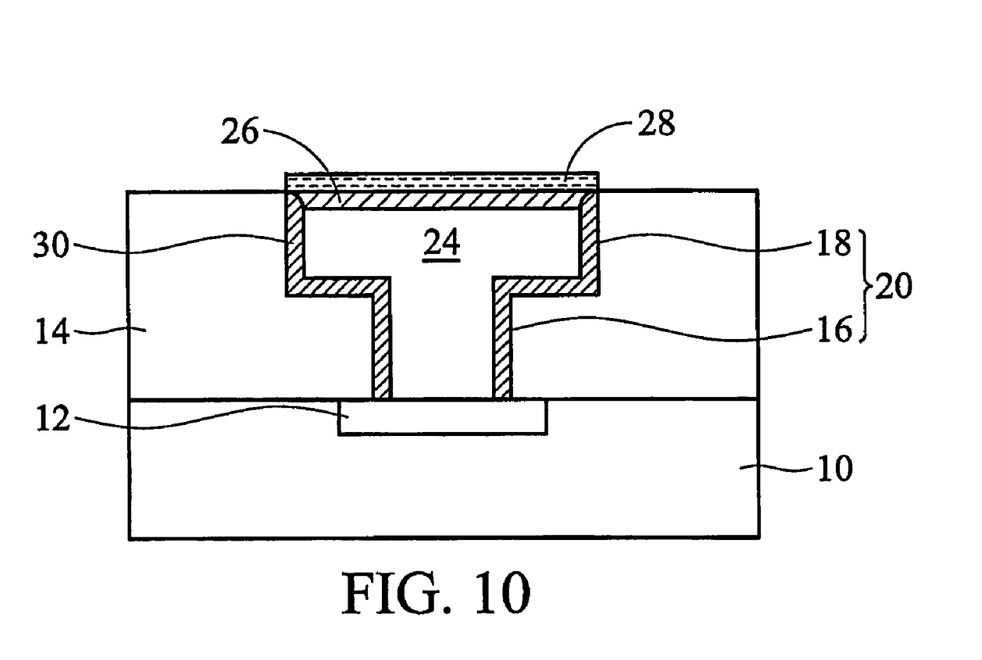

In one embodiment of the present invention as shown in FIG. 6, a copper damascene structure comprises the combination of the conductive polymer layer 30 and the diffusion barrier layer 22 inserted between the ILD layer 14 and the metallic layer 24, as well as the combination of the conductive polymer layer 26 and the metallic capping layer 28 encapsulating the metallic layer 24, while explanation of the same or similar portions to the description in FIGS. 1-5 are omitted.

Figure 11:
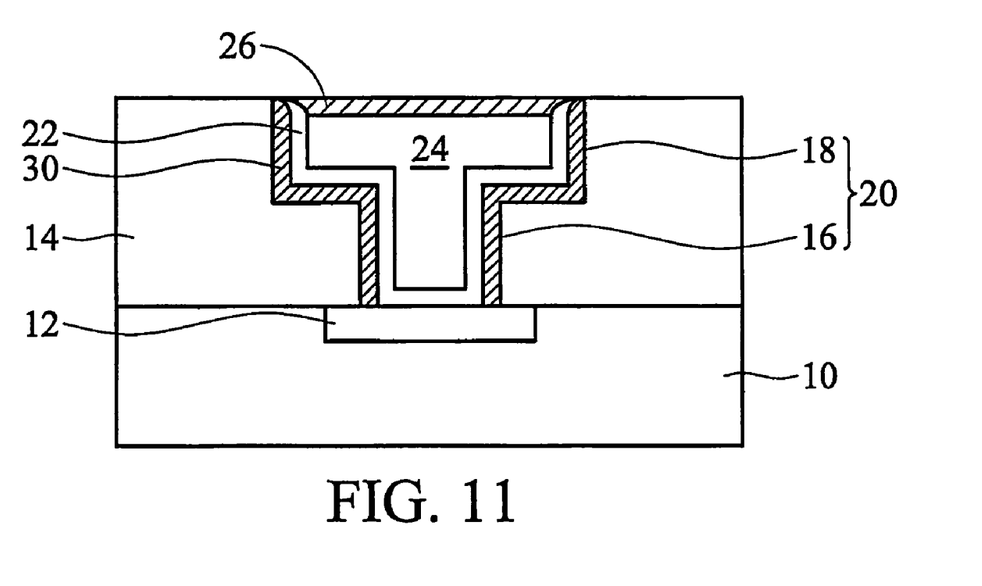
Figure 12:
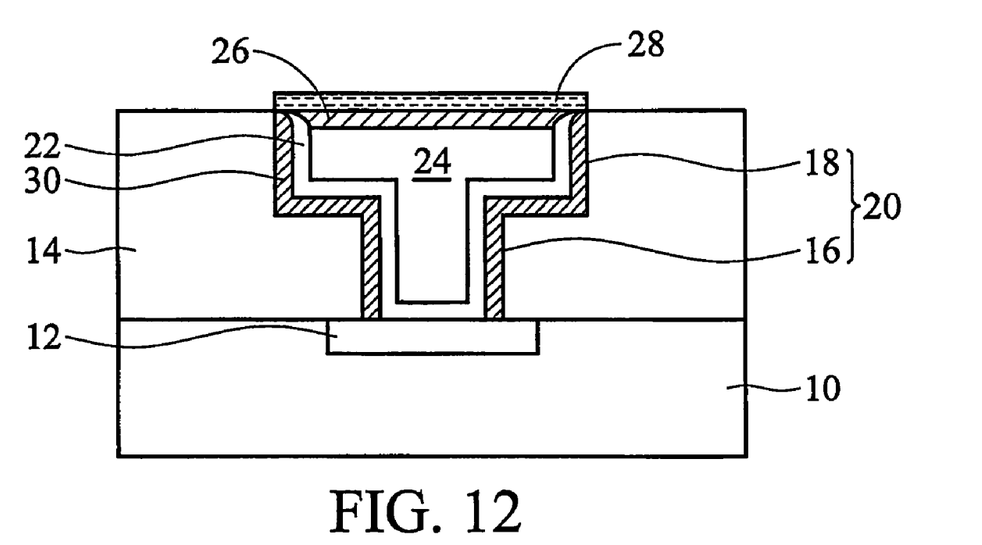

FIGS. 7-12 are cross-sectional diagrams illustrating various copper damascene structures encapsulated by a conductive polymer layer formed in a recess region according to embodiments of the present invention, while explanation of the same or similar portions to the description in FIGS. 1-6 will be omitted. Compared with the conductive polymer layer 26 formed on a planarized surface after the metallic layer 24 is polished down to the upper surface of the ILD layer 14, the conductive polymer layer 26 shown in FIGS. 7-12 is formed in a recess region 25 on the upper surface of the metallic layer 24, thus the resulting structure of the conductive polymer layer 26 and the ILD layer 14 are kept nearly planar. For example, following the CMP process for removing the excess portion of the metallic layer 24 extending to the ILD layer 14, a plasma clean, using $H_2$ or $NH_3$, is then typically performed to reduce copper oxides on the upper surface of the copper layer, thus a recess region 25 of about 50 angstroms to about 1,000 angstroms in depth occurs. The subsequent chemical-grafting process may fill the recess region 25 with the conductive polymer layer 26 to complete the encapsulation barrier layer on the metallic layer 24. Specifically, as shown in FIGS. 11 and 12, the conductive polymer layer 30 may be separated from the conductive polymer layer 26 by the diffusion barrier layer 22 near the top edge of upper trench section 18, causing a discontinuous conductive polymer scheme.

Figure 13:
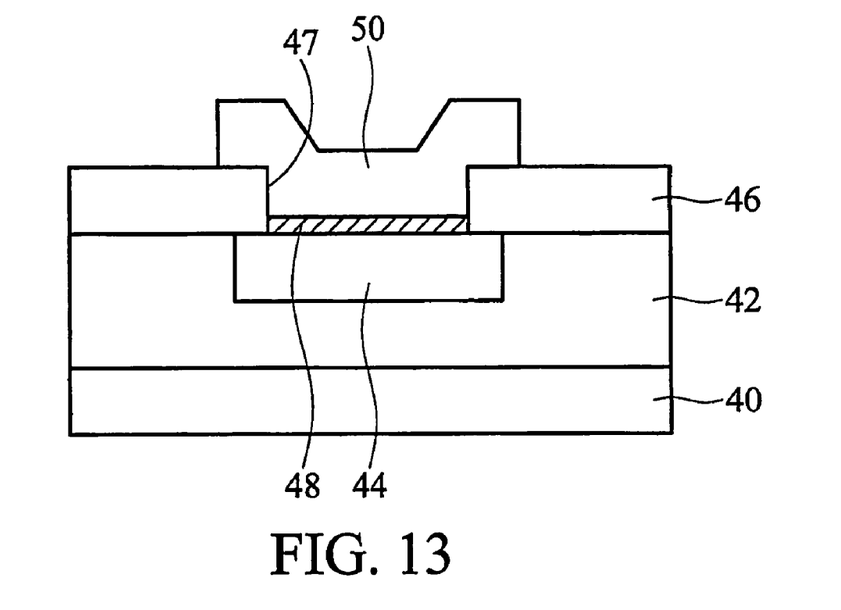
FIG. 13 is a cross-sectional diagram illustrating a stack pad structure with a conductive polymer layer inserted between a copper wiring pad and an aluminum pad according to one embodiment of the present invention.

FIG. 13 is a cross-sectional diagram illustrating a metal pad stack structure with a conductive polymer layer inserted between a copper wiring and an aluminum pad according to one embodiment of the present invention. An example of a substrate 40 used for interconnection fabrication may comprise a semiconductor substrate as employed in a semiconductor integrated circuit fabrication, and integrated circuits may be formed therein and/or thereupon. The integrated circuits as used herein refer to electronic circuits having multiple individual circuit elements, such as transistors, diodes, resistors, capacitors, inductors, and other active and passive semiconductor devices. The substrate 40 comprises an ILD layer 42 and a first level metal wiring 44 embedded in the ILD layer 42. The first level metal wiring 44 is a portion of conductive routes and has an exposed surface treated by a planarization process, such as chemical mechanical polishing (CMP), if necessary. Suitable materials for the first level metal wiring 44 may include, but are not limited to, for example copper, aluminum, copper alloy, or other mobile conductive materials. The ILD layer 42 may include, but is not limited to, $SiO_2$, $SiN_x$, SiON, PSG, BPSG, F-containing $SiO_2$, and various types of low-k films with a dielectric constant less than about 3.9. A passivation layer 46 is deposited and patterned to provide an opening 47 that defines a contact via region of the underlying metal wiring 44. The passivation layer 46 is employed to protect the semiconductor chip from external environment effects. The passivation layer 46 may be formed in a single-layer form or a multi-layer structure including any one of TEOS oxide, $SiN_x$, and plasma enhanced silicon oxide.

Prior to a metal pad process, a conductive polymer layer 48 is selectively deposited on the exposed surface of the first level metal wiring 44 to improve adhesive characteristics between the metal wiring 44 and any overlying layers. The conductive polymer layer 48 is an organic material including electroactive conjugated conducting polymers, such as polyaniline, polypyrrole, polythiophene, polyethylenevinylene or poly-4-vinyl pyridine, through any suitable surface-grafting technique. For example, a chemical-grafting process incorporates a functional group precursor of electroactive conjugated conducting monomers, such as aniline, pyrrole, thiophene, ethylenevinylene or 4-vinyl pyridine. Preferably, the conductive polymer layer 26 comprises poly-4-vinyl pyridine and has a thickness of about 10 angstroms to about 50 angstroms.

A metal layer is deposited over the conductive polymer layer 48 and the passivation layer 46, at least filling the opening 47. Through photolithography, masking and etching techniques, the metal layer is then patterned as a metal pad 50. The metal pad 50 may be formed of aluminum (Al), AlCu or aluminum-based alloy. Further processing may then proceed, for example another patterned passivation layer is optionally provided for subsequent package/assembly processes. The conductive polymer layer 48 provides good adhesion properties for a robust pad metal stack without peeling failures and interface fracture failures, resulting in high reliability as tested by wire bond pull tests.

Figure 14:
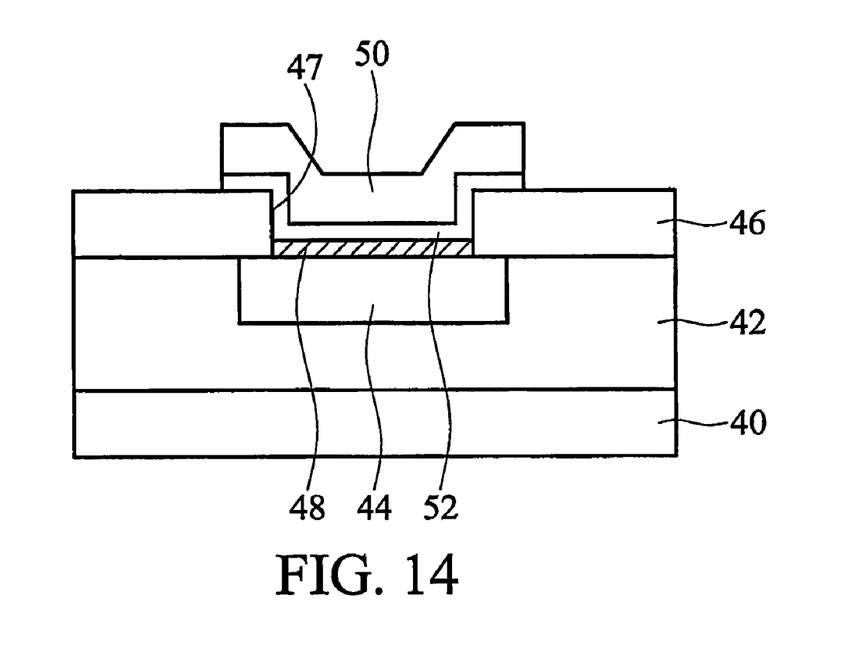
FIG. 14 is a cross-sectional diagram illustrating a robust pad structure with a conductive polymer layer and a diffusion barrier layer inserted between a copper wiring and an aluminum pad according to one embodiment of the present invention.

FIG. 14 is a cross-sectional diagram illustrating a robust pad structure with a conductive polymer layer and a diffusion barrier layer inserted between a copper wiring and an aluminum pad according to one embodiment of the present invention, while explanation of the same or similar portions to the description in FIG. 13 will be omitted. A diffusion barrier layer 52 is further provided, lining the opening 47 of the passivation layer 46 after the formation of the conductive polymer layer 48. The diffusion barrier layer 52 may be formed of Ta, TaN, Ti or TiN.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Several advantageous method embodiments are within the scope of the present invention. These include but are not limited to the following. A method of forming a semiconductor device comprising forming a dielectric layer with an opening on a semiconductor substrate, filling said opening of said dielectric layer with a copper-based metallic layer, selectively forming a first conductive polymer layer on said copper-based metallic layer, and forming a metallic layer on said first conductive polymer layer. The method may include selectively forming a first conductive polymer layer using a chemical-grafting process. Said chemical-grafting process may use an electroactive conjugated conducting monomers as precursor. Said first conductive polymer layer may comprise an organic material including electroactive conjugated conducting polymers comprising polyaniline, polypyrrole, polythiophene, polyethylenevinylene or poly-4-vinyl pyridine. Said metallic layer may comprise copper or copper-based alloys. Said metallic layer may also comprise Co, Ni, Co-based alloys or Ni-based alloys.

The method may also include forming a diffusion barrier layer lining said opening of said dielectric layer before filling said opening with said copper-based metallic layer. Said diffusion barrier layer may comprise Ta, TaN, Ti, TiN or combinations thereof. Said diffusion barrier layer also may comprise Co, Ni, Pt, Ru, W, Pd, or Au. The method may also include selectively forming a second conductive polymer layer lining sidewalls of said opening before filling said opening with said copper-based metallic layer. To selectively form a second conductive polymer layer, an electro-grafting process, a photo-grafting process, an electroless deposition process, or an electroactive conjugated conducting monomers as precursor may be used. Said second conductive polymer layer may comprise an organic material including electroactive conjugated conducting polymers comprising polyaniline, polypyrrole, polythiophene, polyethylenevinylene or poly-4-vinyl pyridine.

The method may also include, after forming said second conductive polymer layer, forming a diffusion barrier layer lining said opening before filling said opening with said copper-based metallic layer. Before selectively forming said first conductive polymer layer, the method may include planarizing said copper-based metallic layer such that said copper-based metallic layer is substantially planar with said dielectric layer.

Before selectively forming said first conductive polymer layer, the method may include forming a recess region in said copper-based metallic layer. Said first conductive polymer layer may be selectively formed in said recess region.

The method may also include forming a semiconductor device providing a dielectric layer with a copper-based metallic layer embedded therein, wherein said copper-based metallic layer has an upper surface, selectively forming a conductive polymer layer on the upper surface of said copper-based metallic layer, and forming an aluminum-based metallic pad over said conductive polymer layer.

Before selectively forming said first conductive polymer layer, the method may also include forming a passivation layer on said dielectric layer and forming an opening in said passivation layer to expose the upper surface of said first metallic layer, wherein, said aluminum-based metallic pad fills said opening of said passivation layer and is electrically connected to said copper-based metallic layer. After selectively forming said first conductive polymer layer, the method may also include forming a diffusion barrier layer along said opening of said passivation layer before forming said aluminum-based pad. Said diffusion barrier layer may comprise Ta, TaN, Ti, TiN or combinations thereof.

What is claimed is:

1. A semiconductor device, comprising:
    a substrate;
    a first dielectric layer over the substrate, the first dielectric layer having an opening on a first upper surface;
    a copper-based metallic layer filling said opening of said first dielectric layer;
    a first conductive polymer layer completely covering and in contact with the upper surface of said copper-based metallic layer, the first conductive polymer layer having a second upper surface located further from the substrate than the first upper surface; and
    a second dielectric layer over both the first dielectric layer and the first conductive polymer layer and in physical contact with at least a portion of the first dielectric layer.

2. The semiconductor device of claim 1, wherein said first conductive polymer layer is an organic material including electroactive conjugated conducting polymers comprising polyaniline, polypyrrole, polythiophene, polyethylenevinylene or poly-4-vinyl pyridine.

3. The semiconductor device of claim 1, further comprising a metallic layer located over said first conductive polymer layer.

4. The semiconductor device of claim 3, wherein said metallic layer comprises copper or copper-based alloys.

5. The semiconductor device of claim 3, wherein said metallic layer comprises Co, Ni, Co-based alloys or Ni-based alloys.

6. The semiconductor device of claim 1, wherein said first dielectric layer has a dielectric constant less than about 3.9.

7. The semiconductor device of claim 1, further comprising a diffusion barrier layer lining said opening of said first dielectric layer, wherein said diffusion barrier layer is inserted between said copper-based metallic layer and said first dielectric layer.

8. The semiconductor device of claim 7, wherein said diffusion barrier layer comprises Ta, TaN, Ti, TiN or combinations thereof.

9. The semiconductor device of claim 7, wherein said diffusion barrier layer comprises Co, Ni, Pt, Ru, W, Pd, or Au.

10. The semiconductor device of claim 1, further comprising a second conductive polymer layer lining sidewalls of said opening, wherein said second conductive polymer layer is inserted between said copper-based metallic layer and said first dielectric layer.

11. The semiconductor device of claim 10, wherein said second conductive polymer layer is connected to said first conductive polymer layer.

12. The semiconductor device of claim 10, further comprising a diffusion barrier layer lining said opening of said first dielectric layer, wherein said diffusion barrier layer is inserted between said second conductive polymer layer and said copper-based metallic layer.

13. The semiconductor device of claim 12, wherein said diffusion barrier layer comprises Ta, TaN, Ti, TiN or combinations thereof.

14. The semiconductor device of claim 12, wherein said diffusion barrier layer comprises Co, Ni, Pt, Ru, W, Pd, or Au.

15. The semiconductor device of claim 10, wherein said second conductive polymer layer is an organic material including electroactive conjugated conducting polymers comprising polyaniline, polypyrrole, polythiophene, polyethylenevinylene or poly-4-vinyl pyridine.

16. The semiconductor device of claim 1, wherein the upper surface of said copper-based metallic layer is substantially planar with said first dielectric layer.

17. The semiconductor device of claim 1, wherein said first conductive polymer layer is substantially planar with said first dielectric layer.

18. A semiconductor device, comprising:
    a copper-based metallic layer embedded in a dielectric layer and having an upper surface;
    an aluminum-based metallic pad located over said copper-based metallic layer; and
    a conductive polymer layer located between and separating the copper-based metallic layer and the aluminum-based metallic pad, the conductive polymer layer being in contact with the upper surface of said copper-based metallic layer but not substantially extending beyond the copper-based metallic layer in a direction substantially parallel to the upper surface.

19. The semiconductor device of claim 18, wherein said conductive polymer layer is an organic material including electroactive conjugated conducting polymers comprising polyaniline, polypyrrole, polythiophene, polyethylenevinylene or poly-4-vinyl pyridine.

20. The semiconductor device of claim 18, further comprising a passivation layer located on said dielectric layer and having an opening that defines the upper surface of said copper-based metallic layer.

21. The semiconductor device of claim 20, further comprising a diffusion barrier layer lining said opening of said passivation layer, wherein said diffusion barrier layer is inserted between said aluminum-based metallic pad and said conductive polymer layer.

22. The semiconductor device of claim 21, wherein said diffusion barrier layer comprises Ta, TaN, Ti, TiN or combinations thereof.

23. The semiconductor device of claim 18, wherein said dielectric layer has a dielectric constant less than about 3.9.

* * * * *